(12) United States Patent
Kamiya et al.

(10) Patent No.: US 7,834,441 B2
(45) Date of Patent: Nov. 16, 2010

(54) MULTILAYER SUBSTRATE AND METHOD OF MANUFACTURING THE SAME

(75) Inventors: Hiroki Kamiya, Nagoya (JP); Motoki Shimizu, Nagoya (JP); Satoshi Takeuchi, Nagoya (JP)

(73) Assignee: DENSO CORPORATION, Kariya (JP)

( * ) Notice: Subject to any disclaimer, the term of this patent is extended or adjusted under 35 U.S.C. 154(b) by 471 days.

(21) Appl. No.: 11/902,675

(22) Filed: Sep. 25, 2007

(65) Prior Publication Data

US 2008/0136013 A1 Jun. 12, 2008

(30) Foreign Application Priority Data

Dec. 6, 2006 (JP) ............... 2006-329856

(51) Int. Cl.
*H01L 23/14* (2006.01)
*H01L 23/053* (2006.01)

(52) U.S. Cl. .............. 257/702; 257/701; 257/778; 257/E23.173

(58) Field of Classification Search .......... 257/702, 257/701, E23.173, 778
See application file for complete search history.

(56) References Cited

U.S. PATENT DOCUMENTS

| | | | | |
|---|---|---|---|---|
| 5,497,033 A | * | 3/1996 | Fillion et al. | ............. 257/723 |
| 5,565,706 A | * | 10/1996 | Miura et al. | ............. 257/723 |
| 5,870,289 A | * | 2/1999 | Tokuda et al. | ............. 361/779 |
| 5,994,648 A | | 11/1999 | Glovatsky et al. | |
| 6,271,469 B1 | * | 8/2001 | Ma et al. | ............. 174/521 |
| 6,359,235 B1 | * | 3/2002 | Hayashi | ............. 174/260 |
| 6,680,441 B2 | | 1/2004 | Kondo et al. | |
| 7,165,321 B2 | | 1/2007 | Kondo et al. | |
| 7,420,273 B2 | * | 9/2008 | Liu et al. | ............. 257/712 |
| 2006/0042078 A1 | | 3/2006 | Takeuchi et al. | |
| 2006/0154496 A1 | | 7/2006 | Imamura et al. | |

FOREIGN PATENT DOCUMENTS

JP A-2005-142178 6/2005

OTHER PUBLICATIONS

Office action dated Mar. 27, 2009 issued from the Chinese Patent Office for counterpart application No. 2007101817912 (English translation enclosed).
Office Action mailed Feb. 10, 2010 from German Patent Office in corresponding DE Application No. 10 2007 058 555.3-34 (and English translation).

* cited by examiner

*Primary Examiner*—Nitin Parekh
(74) *Attorney, Agent, or Firm*—Posz Law Group, PLC

(57) ABSTRACT

A multilayer substrate includes an insulating base member having a plurality of resin films, an electric element embedded in the insulating base member, and a spacer. The resin films are made of a thermoplastic resin and stacked and attached to each other. At least one resin film has a through hole for inserting the electric element. The one resin film further has a plurality of protruding members. One protruding member opposes to another one protruding member so that the one and the another one contact and sandwich the electric element. The spacer is arranged between the one resin film and an adjacent resin film and is disposed at a base portion of one of the protruding members.

6 Claims, 7 Drawing Sheets

MULTILAYER SUBSTRATE AND METHOD OF MANUFACTURING THE SAME

CROSS REFERENCE TO RELATED APPLICATION

This application is based on Japanese Patent Application No. 2006-329856 filed on Dec. 6, 2006, the content of which is incorporated herein by reference in its entirety.

BACKGROUND OF THE INVENTION

1. Field of the Invention

The present invention relates to a multilayer substrate and a method of manufacturing the same.

2. Description of the Related Art

US 2006/0042078 A (corresponding to JP 2006-73763 A) discloses a manufacturing method of a multilayer substrate that includes an insulating base member and an electronic element embedded in the insulating base member. In the manufacturing method, the insulating base member includes a plurality of resin films and a part of the resin films has a through hole, in which the electric element is inserted. At least one of the resin films having the through hole is provided with a plurality of protruding members. The protruding members protrude from surrounding portions of the through hole into the through hole. The protruding members are arranged so that a distance between opposing tips (top ends) of the protruding members is shorter than an outside dimension of the electronic element. The electric element is inserted in the through hole while crushing the tips of the protruding members. A stacked body of the resin films, in which the electric element is arranged, is pressed with heat to form the multilayer substrate.

The electronic element inserted in the through hole is fixed by the resin film having the protruding members, thereby the electronic element is restricted from getting into an interlaminar of the stacked resin films or jumping out from the through hole due to vibrations generated by inserting another electronic element into an adjacent through hole or carrying the stacked body to a next process. Thus, the electronic element is restricted from displacing during a manufacturing process.

According experiments by the inventor of the present application, in a case where the electronic element is out of position with respect to the through hole when the electronic element is inserted in the through hole, the electronic element may chip off the protruding members and may generate a resin dust. In addition, the resin dust may affect a connection between an electrode in the electronic element and a conductive pattern. In contrast, in a case where the electronic element is positioned with respect to the through hole with a high accuracy, it may take a long time to inserting the electronic element. Thus, the positioning of the electric element with a high accuracy is unsuitable for a case where a plurality of electronic elements is inserted in a multilayer substrate.

It is required to restrict a generation of a resin dust when an electronic element is inserted in a through hole of stacked resin films, while inserting the electric element in a short time.

SUMMARY OF THE INVENTION

It is therefore an object of the present invention to provide a multilayer substrate. Another object of the invention is to provide a manufacturing method of a multilayer substrate.

According to an aspect of the invention, a multilayer substrate includes an insulating base member, an electric element embedded in the insulating base member, and a spacer. The insulating base member includes a plurality of conductive patterns and a plurality of resin films, which is made of a thermoplastic resin and stacked and attached to each other. The electric includes an electrode electrically coupled with at least one of the conductive patterns. At least one resin film has a through hole in which the electric element is inserted. The one resin film further has a plurality of protruding members, each of which protrudes from a surrounding portion of the through hole into the through hole. One protruding member opposes to another one protruding member so that the one and the another one contact and sandwich the electric element. The spacer is disposed between the one resin film and an adjacent resin film, and disposed at a base portion of one of the protruding members.

In the present multilayer substrate, the spacer is arranged at the base portion of one of the protruding members, thereby the protruding member is restricted from being chipped off by the electric element. Thus, the multilayer substrate is restricted from generating a resin dust.

According to another aspect of the invention, a method of manufacturing a multilayer substrate includes a step of preparing a plurality of resin films, a step of stacking the resin films and a spacer, a step of press-inserting an electric element, and a step of heating and pressing the stacked resin films. In the step of preparing the resin films, the resin films are made of a thermoplastic resin, and at least one resin film has a through hole for inserting an electric element and other resin film has no through hole. The one resin film further includes a plurality of protruding members, each of which protrudes from a surrounding portion of the through hole into the through hole. One protruding member opposes to another one protruding member so that a distance between top ends of the one and the another one is shorter than an outside dimension of the electric element. In the step of stacking the resin films and the spacer, the spacer is arranged between the one resin film and an adjacent resin film and disposed at a base portion of one of the protruding members. In the step of press-inserting the electric element, the electric element is press-inserted in the through hole by crushing the top ends of the protruding members with the electric element. In the step of heating and pressing the stacked resin films, an insulating base member is formed from the stacked resin films and the electric element is embedded in the insulating base member.

In the present manufacturing method, when the electric element is inserted in the through hole, the protruding member pressed by the electric element may bend from the spacer as a supporting point with a large bending angle. Thereby, even when the electric element is out of position with respect to the through hole, the electric element is pushed toward a center portion of the through hole by a reaction force from the protruding members before the protruding members receive a force over a break strength of the protruding members. As a result, the present manufacturing method restricts a generation of a resin dust due to inserting of the electric element.

Furthermore, the electric element is fixed by the one resin film having the protruding members, thereby the electric element is restricted from getting into an interlaminar of the stacked resin films. Therefore, the electric element is restricted from displacing during a manufacturing process.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS

A process that the inventor of the present application creates the present invention will be described before describing preferred embodiments of the invention.

Figure 1:
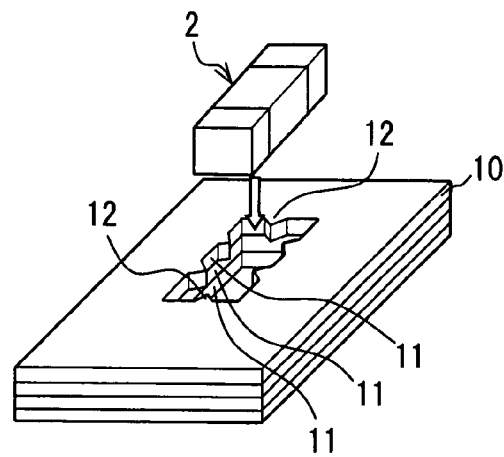
FIG. 1 is a perspective view showing a process of inserting an electronic element into a through hole of stacked resin films according to a prior art.

At first, a multilayer substrate including an insulating base member and an electric element embedded in the insulating base member is manufactured based on a method disclosed in US 2006/0042078 A (corresponding to JP 2006-73763 A). In the manufacturing method, an electric element 2 is inserted in a through hole 11 of stacked resin films 10 as shown in FIG. 1.

According to experiments by the inventor, in a case where the electronic element 2 is out of position with respect to through hole 11 when the electronic element 2 is inserted in the through hole 11, the electronic element 2 may chip off protruding members 12 from the resin film 10 and may generate a resin dust. The resin dust (i.e., damage of the protruding members 12) may generate in a following mechanism.

Figure 2A:
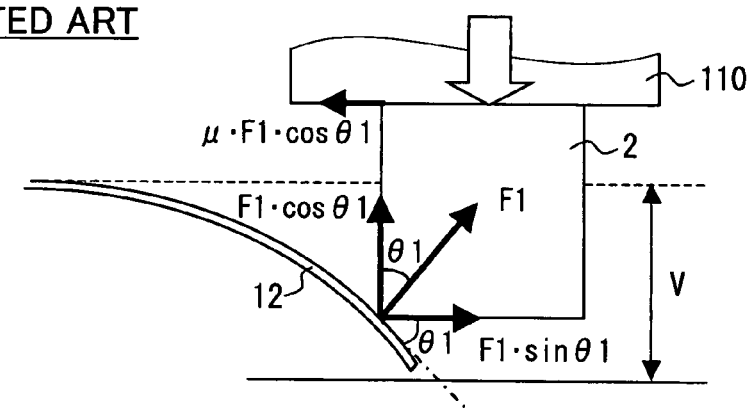
FIGS. 2A and 2B are schematic diagrams showing a relationship between bending and damaging of a protruding member according to a related art by the inventor of the present application.

As shown in FIG. 2A, a friction coefficient between the electronic element 2 and a pressing member 110 for pressing the electronic element 2 into the through hole 11 is determined as "$\mu$", a bending angle of the protruding member 12 pressed by the pressing member 110 through the electronic element 2 is determined as "$\theta1$", a reaction force of the protruding member 12 pressed by the electronic element 2 is determined as "F1", and a bendable amount of the protruding member 12 is determined as "V". Thereby, a horizontal component of the reaction force "F1" is expressed as "F1·sin $\theta1$", and a vertical component of the reaction force "F1" is expressed as "F1·cos $\theta1$". In addition, a frictional force between the pressing member 110 and the electronic element 2 is expressed as "$\mu$·F1·cos $\theta1$". Thus, when following formula (1) is satisfied, the electric element 2 is pushed toward a center portion of the through hole 11 (i.e., right side in FIG. 2A) due to the reaction force of the protruding member 12 pressed by the electronic element 2.

$$F1 \cdot \sin \theta1 > \mu \cdot F1 \cdot \cos \theta1 \quad (1)$$

Formula (1) can be replaced with formula (2).

$$\tan \theta1 > \mu \quad (2)$$

Thus, the electric element 2 is pushed toward the center portion of the through hole 11 when the bending angle "$\theta1$" is large. Specifically, the electric element 2 is certainly pushed toward the center portion of the through hole 11 when $\theta1 \geq 45°$, because the friction coefficient $\mu < 1$.

Figure 2B:
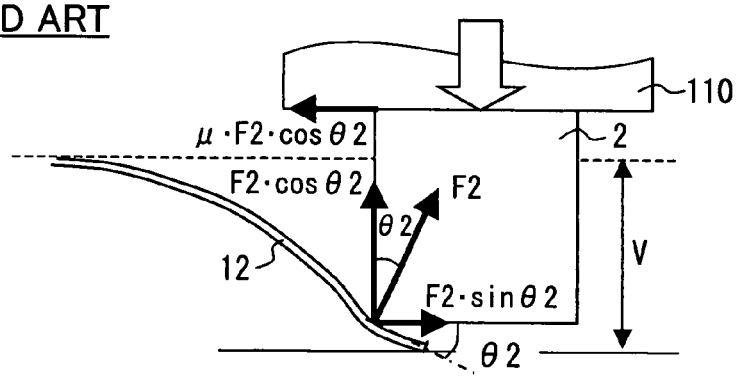

As shown in FIG. 2B, in a case where a deforming amount of the protruding member 12 reaches the bendable amount "V" without satisfying the above formulas (1) and (2), and the protruding member 12 is pressed in a state where the protruding member 12 cannot bend downward any more, a bending angle "$\theta2$" is getting into smaller than the bending angle "$\theta1$" in FIG. 2A. In the present case, a horizontal component "F2·sin $\theta2$" of a reaction force "F2" is smaller than a frictional force "$\mu$·F2·cos $\theta2$" between the pressing member 110 and the electronic element 2. Thus, the electronic element 2 is not pushed toward the center portion of the through hole. When the electronic element 2 is provided with a force over a break strength of the protruding member 12 so that the electric element is forcibly inserted into the through hole 11, the electric element 2 may chip off the protruding member 12. In this way, the protruding member 12 may be damaged.

Figure 3:
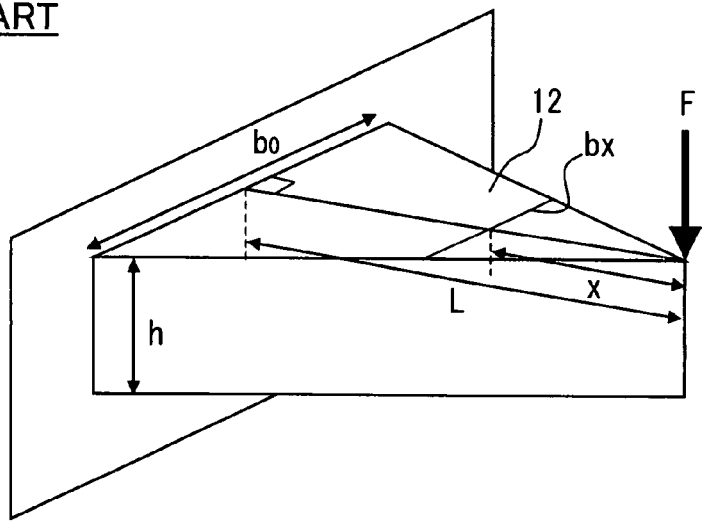
FIG. 3 is a schematic perspective view of a protruding member according to another related art by the inventor.

In another examination by the inventor, the protruding member 12 is modeled on a cantilever planar triangle, as shown in FIG. 3. When a tip of the protruding member 12 is applied with a load "F", a bending amount "V(x)" and a bending angle "dV(x)/dx" (=$\theta$) at a point "x" are expressed by following formulas (3) and (4).

$$V(x) = 12L/Eb_0 h^2 (\tfrac{1}{2}Fx^2 - FLx + \tfrac{1}{2}FL^2) \quad (3)$$

$$dV(x)/dx = 12L/Eb_0 h^2 (Fx - FL) \quad (4)$$

Wherein, "h" is a thickness of the protruding member 12, "L" is a length between a supporting point and the tip of the protruding member 12, "$b_0$" is a width of a base portion of the protruding member 12, "bx" is a width of the protruding member 12 at a point "x", and "E" is Young's modulus. When x=0, formulas (3) and (4) are expressed by formulas (5) and (6).

$$V(0) = 6FL^3 / Eb_0 h^2 \quad (5)$$

$$dV(0)/dx = -2V(0)/L \quad (6)$$

When the bending amount "V" is constant, the bending angle "dV(x)/dx" (=$\theta$) is expressed as a function of only the length "L" of the protruding member 12. Thus, when the length "L" between the supporting point and the tip of the protruding member 12 is short, the bending angle "$\theta$" is large, thereby the electric element 2 may be pushed toward the center portion of through hole 11 before the protruding member 12 is damaged.

First Embodiment

Figure 4:
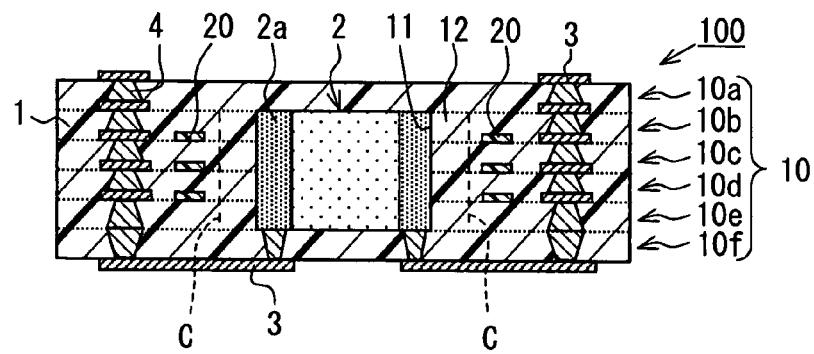
FIG. 4 is a schematic cross-sectional view of a multilayer substrate according to a first embodiment of the invention.

As shown in FIG. 4, a multilayer substrate 100 includes an insulating base member 1 and an electric element 2 embedded in the insulating base member 1. The insulating base member 1 includes a plurality of resin films 10 attached each other. For example, the resin films 10 includes six resin films 10a to 10f having a thermal plasticity and arranged in order from top to bottom. The multilayer substrate 100 also includes conductive patterns 3 having a multilayer structure and coupled with each other through conductive members 4. The conductive members 4 are made of a sintered conductive paste. The electronic element 2 has electrodes 2a coupled with the conductive patterns 3 through the conductive members 4. In the six resin films 10a to 10f, four resin films 10b to 10e arranged between a top resin film 10a and a bottom resin film 10f have a through hole 11, for inserting the electric element 2. Each of the four resin films 10b to 10d has a plurality of protruding members 12 protruding from surrounding portions of the through hole 11 shown by dotted lines C in FIG. 4 into the through hole 11. One protruding member 12 opposes to another one protruding member 12 so that the one and the another one contact and sandwich the electric element 2. The protruding members 12 are integrated with the insulating base member 1.

The multilayer substrate 100 further includes a plurality of spacers 20 having a certain thickness. The spacers 20 are arranged between each of the resin films 10b to 10e. Specifically, the spacers 20 are arranged at base portions of the protruding members 12. In the present example, a material of the spacers 20 is different with those of other components in the multilayer substrate 100 but has a similar linear-expansion coefficient. Additionally, the spacers 20 are thinner than the resin films 10a to 10f.

Figure 5A:
FIGS. 5A to 5D are cross-sectional views showing a manufacturing process of a resin film to form the multilayer substrate according to the first embodiment.

A manufacturing method of the multilayer substrate 100 will now be described with reference to FIGS. 5A-11. At first, a manufacturing process of the resin film 10b will be described with reference to FIGS. 5A-6. As shown in FIG. 5A, a metal film is attached to a surface of a film 1a made of a thermoplastic resin such as a liquid crystal polymer and is patterned by photolithography and etching to form the conductive patterns 3. As a thermoplastic resin for a material of the film 1a, polyether ether ketone (PEEK), polyetherimide (PEI), and polyether ether ketone (PEEK)/polyetherimide (PEI) composite and the like may be used instead of the liquid crystal polymer. A preferred metal film for the conductive patterns 3 is copper film, which has a high electric conductivity and a high strength.

Figure 6:
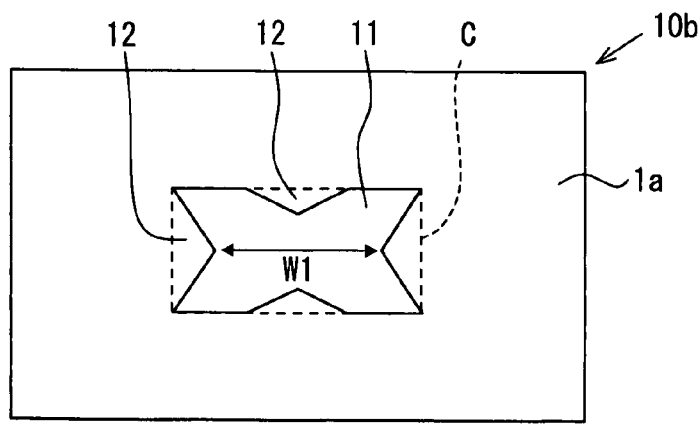
FIG. 6 is a plane view of the resin film formed by the manufacturing process shown in FIGS. 5A to 5D.
Figure 5B:
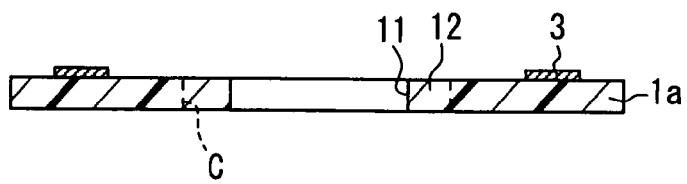

Next, as shown in FIG. 5B, the through hole 11 is provided in the film 1a by laser processing. When the through hole 11 is provided, the protruding members 12 are formed to protrude from the surrounding portions shown by the dotted lines C into the through hole 11, as shown in FIG. 6. One protruding member 12 opposes to another one protruding member 12. In the present example, opposing two pairs of protruding members 12 (i.e., four protruding members 12) are formed. In addition, the through hole 11 and the protruding members 12 are formed so that a distance W1 between top ends of the opposing protruding members 12 is shorter than an outside dimension of the electric element 2. The protruding members 12 may have various shapes. In a case where the protruding members 12 have approximately triangle planar shapes, spring constants are smaller than a case where the protruding member 12 have approximately rectangular planar shapes when the distance W1 and a size of the through hole 11 are almost same in both of the cases. Therefore, when the protruding members 12 have approximately triangle planar shapes, the electric element 2 is easily inserted into the through hole 11.

Figure 5C:
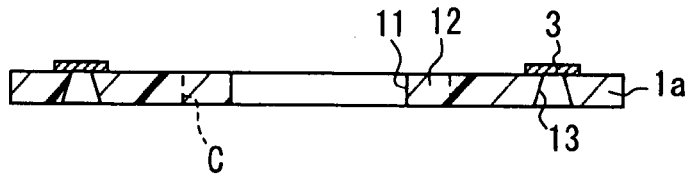
Figure 5D:
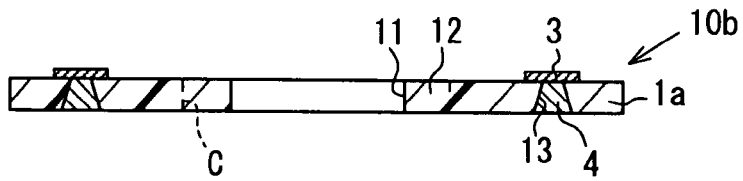

After providing the through hole 11, bottomed holes 13 are provided by laser processing, as shown in FIG. 5C. The bottomed holes 13 are bottomed with the conductive patterns 3. Then, a conductive paste 4 is filled in the bottomed holes 13 by a screen-printing method. When the conductive paste 4 is filled in the bottomed holes 13, protective films may be attached to an upper surface and a lower surface of the film 1a to restrict a pollution of the film 1a by the conductive paste 4 and a damage of the conductive patterns 3, and may remove the protective films after filling the conductive paste 4.

The resin films 10c to 10e are formed by manufacturing processes similar with that of the resin film 10b. In addition, the resin films 10a and 10f are made by the manufacturing process of the resin film 10b without providing the through hole 11 as shown in FIG. 5B.

Figure 7A:
FIG. 7A is a cross-sectional view of a spacer according to the first embodiment.
Figure 7B:
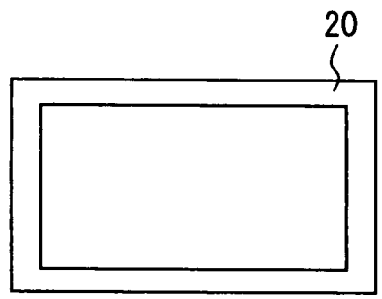
FIG. 7B is a plane view of the spacer.
Figure 8:
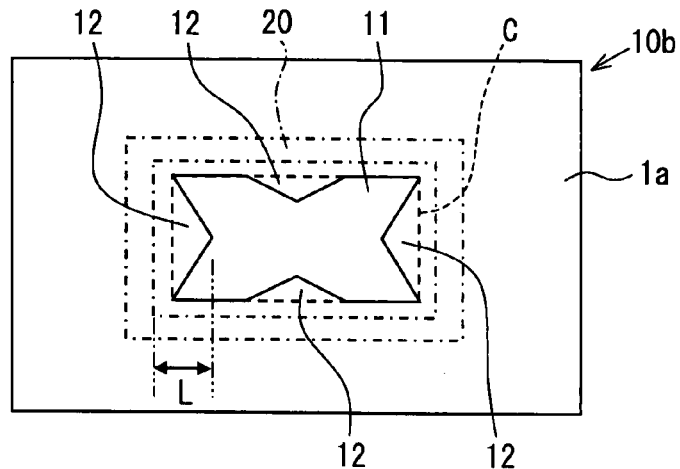
FIG. 8 is a plane view showing a positional relation of the protruding members and the spacer according to the first embodiment.

The spacers 20 are formed separately from the resin films 10a to 10f. When the multilayer substrate 100 is formed, the spacers 20 are arranged between at least one of the resin films 10b to 10e having the protruding members 12 and an adjacent resin film in a direction that the electric element 2 is inserted. Furthermore, the spacers 20 are arranged at the base portions of the protruding members 12. Thereby, the spacers 20 function as supporting points of the protruding members 12 when the protruding members 12 are deformed elastically by receiving a force from the electric element 2 in an arranging process of the electric element 2. Thus, the protruding members 12 may be made of various materials that can function as the supporting points. In the present example, the spacers 20 are made of a resin film that is restricted from fluidizing in a heating/pressing process and has a similar linear-expansion coefficient with those of the films 1a. In addition, the spacers 20 are thinner than the films 1a (i.e., the resin films 10a to 10f). As shown in FIGS. 7A and 7B, the spacers 20 are formed into approximately rectangular ring shapes by punching the resin films, thereby the spacers 20 correspond to the base portions of the four protruding members 12 as shown in FIG. 8.

Figure 9A:
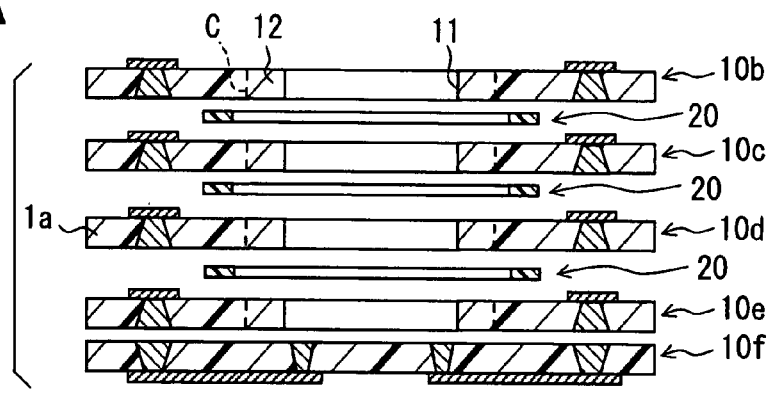
FIGS. 9A to 9C are cross-sectional views showing a stacking process of the resin films and an arranging process of the electronic element.

Then, the resin films 10a to 10f and the spacers 20 are stacked and the electric element 2 is inserted. Specifically, as shown in FIG. 9A, the resin films 10b to 10f are positioned so that the through holes 11 provided in the resin films 10b to 10f are connected to form a concave part for inserting the electric element 2 therein. At this time, the spacers 20 are arranged between each of the resin films 10b to 10e and adjacent to the through hole 11. Thus, in the four resin films 10b to 10e having the protruding members 12, upper three resin films 10b to 10d, in which the electric element 2 is inserted before the resin film 10e, are used for restricting a displacement of the electric element 2, i.e., centering of the electric element 2. The protruding members 12 of the resin film 10e, which are not used for restricting a displacement of the electric element 2, are used with the protruding members 12 of the resin films 10b to 10d, for fixing the electric element 2 after inserting, and covering the electric element 2 after heating and pressing.

In the present example, the four resin films 10b to 10e have the through hole 11. However, the number of stacked resin films having the through hole 11 may be determined in accordance with a height of the electric element 2. In addition, the number of stacked spacers 20 may be determined in accordance with the number of the resin films having the protruding members 12 used for restricting the displacement of the electric element 2.

Figure 9B:
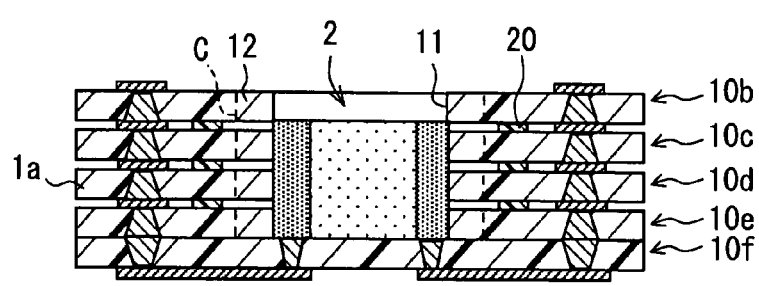
Figure 10A:
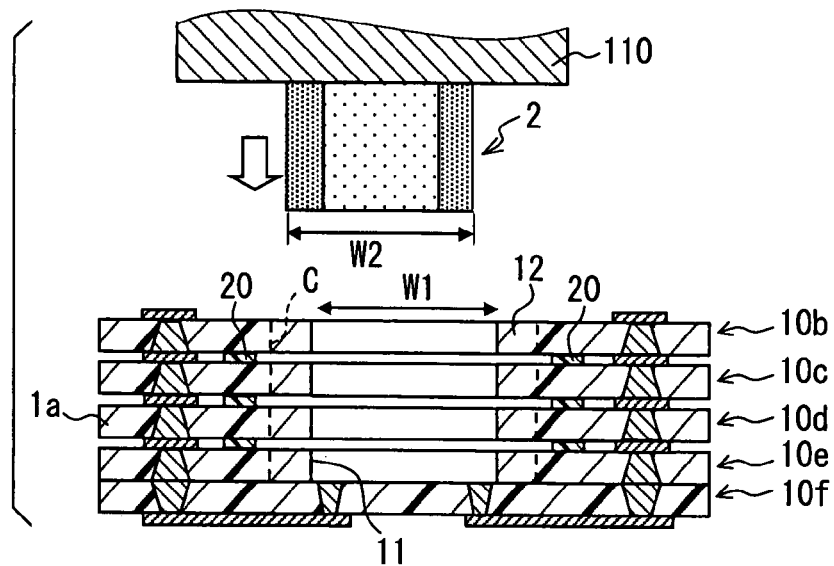
FIGS. 10A to 10C are cross-sectional views showing the detail of the arranging process of the electronic element.
Figure 10B:
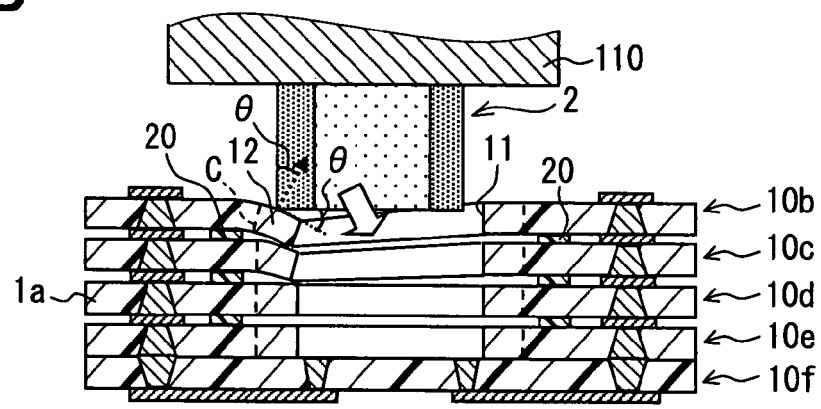

Next, the electric element 2 is pressed into the through hole 11 provided with the protruding members 12 while crushing the top ends of the protruding members 12, as shown in FIG. 9B. As shown in FIG. 10A, the distance W1 between the top ends of the protruding members 12 of the resin films 10b to 10e are set to be shorter than the outside dimension W2 of the electric element 2. In addition, the spacers 20 are arranged at the base portions of the protruding members 12. Thus, when the electric element 2 is inserted into the through hole 11 by pressed by the pressing member 110, the protruding member 12 pressed by the electric element 2 are elastically deformed from adjacent spacers 20 as the supporting points with a large bending angle "θ" as shown in FIG. 10B. Thereby, even when the electric element 2 is out of position with respect to the through hole 11 as shown in FIG. 10A, the electric element 2 is pushed toward the center portion of the through hole 11 by a horizontal component of a reaction force from the protruding members 12 before the protruding members 12 receive a force over the break strength of the protruding members 12, as shown in FIG. 10B. As a result, the electric element 2 is arranged in the through holes 11. In this way, the protruding members 12 are restricted from damaging due to inserting of the electric element 2, and the multilayer substrate 100 restricts a generation of a resin dust.

In the present example, the protruding members 12 are formed so that the friction coefficient "μ" between the pressing member 110 and the electric element 2 and the bending angles "θ" of the protruding members 12 satisfy the above-described formula (2). Thus, even when the electric element 2 is out of position with respect to the through hole 11, the electric element 2 is pushed toward the center portion of the through hole 11 by the horizontal component of the reaction force from the protruding members 12 before the protruding members 12 receives a force over the break strength of the protruding members 12.

Figure 10C:
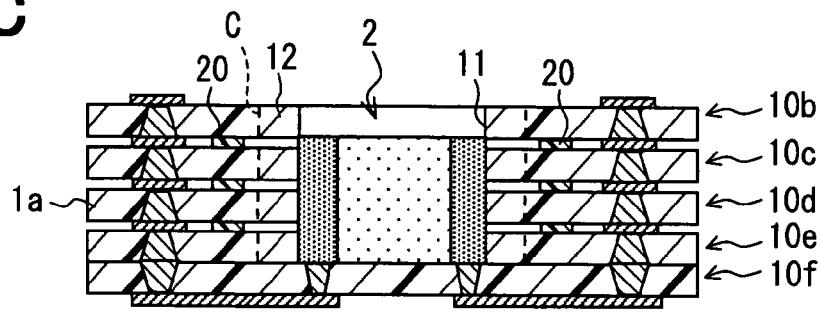
Figure 11:
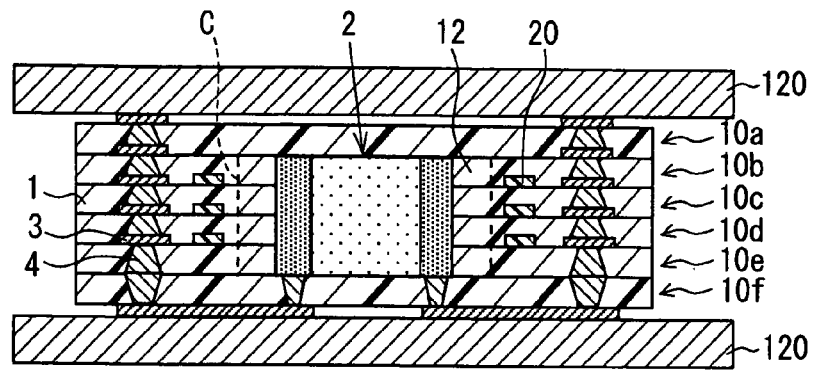
FIG. 11 is a cross-sectional view showing a heating and pressing process.

As shown in FIGS. 9B and 10C, the electric element 2 inserted into the concave part provided by the connected through holes 11 is fixed by the resin films 10b to 10e having the protruding members 12. Thus, the electronic element 2 is restricted from getting into an interlaminar of the stacked resin films 10 or jumping out from the concave part due to vibrations generated by inserting another electronic element (not shown) into an adjacent through hole (not shown) or carrying a stacked body to a next process.

Figure 9C:
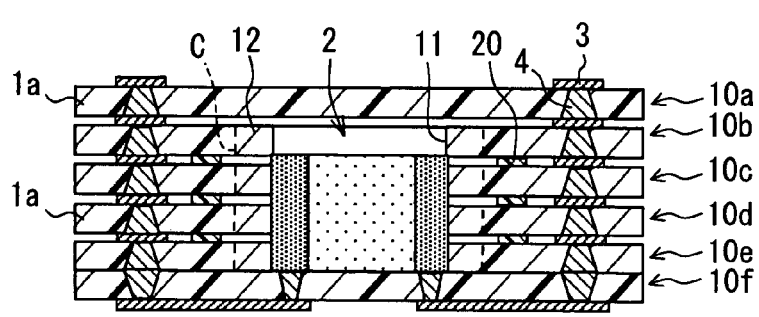

After the electric element 2 is arranged, the resin film 10a without the through hole 11 is stacked on the stacked body including the resin films 10b to 10f, as shown in FIG. 9C.

The stacked body including the resin films 10a to 10f, the electric element 2, and the spacers 20 is put between a pair of heat pressing plates 120 having heaters. Then, the stacked body is heated and pressed by the heat pressing plates 120 from the both sides. A preferred applied pressure is about 4 MPa. A preferred heating temperature is about in a range from 300 to 350° C. when the thermoplastic resin films 1a are made of a liquid crystal polymer. When the stacked body is heated and pressed, the thermoplastic resin films 1a are softened. Thereby, the resin films 10a to 10f are attached to each other so that the insulating base member 1 is formed. In addition, clearances around the electric element 2 are entirely filled with flowing films 1a, thereby the electric element 2 is embedded in the insulating base member 1. Furthermore, when the stacked body is heated and pressed, the conductive paste 4 is sintered so that the conductive members 4 for electrically coupling the conductive patterns 3 are formed. In this way, the multilayer substrate 100 shown in FIG. 4 is formed.

The present manufacturing method of the multilayer substrate 100 restricts a generation of a resin dust when the electric element 2 is inserted. Thus, the multilayer substrate 100 manufactured by the present method restricts a poor connection between the electrodes 2a of the electric element 2 and the conductive patterns 3. According to experiments by the inventor, it is confirmed that, when the electric element 2 is intentionally displaced with respect to the through hole 11 when the electric element 2 is inserted into the through hole 11, the present manufacturing method restricts a generation of a resin dust compared with the manufacturing method according to the prior art.

In addition, the present manufacturing method restricts the electric element 2 from getting into an interlaminar of the stacked resin films 10b to 10f, thereby a displacement of the electric element 2 in the manufacturing process is restricted. Furthermore, the present manufacturing method restricts a generation of a resin dust, thereby a plurality of electric elements 2 can be inserted in a short time using a high speed mounter.

The spacers 20 are thinner than the resin films 10a to 10f in a direction that the resin films 10a to 10f are stacked, thereby steps due to the spacers 20 are easily filled with the softened films 1a. Thus, clearances remaining in the insulating base member 1 are reduced when the multilayer substrate 100 is formed.

Figure 12:
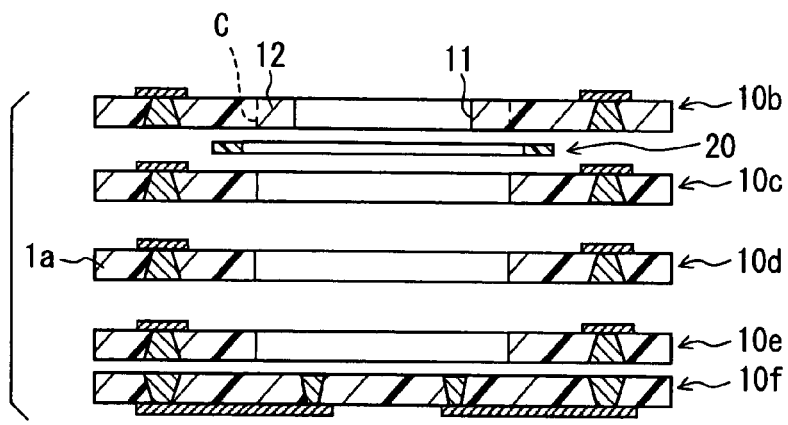
FIG. 12 is a cross-sectional view showing a stacked body according to a modification of the first embodiment.
Figure 13:
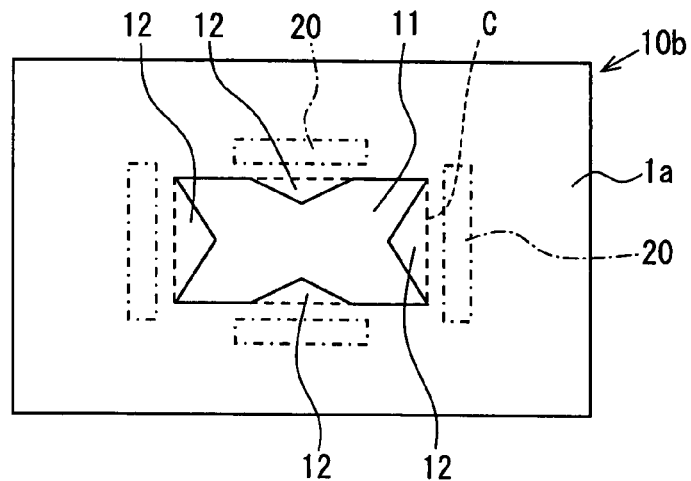
FIG. 13 is a plane view of a spacer according to another modification of the first embodiment.

In the above-described example, all of the resin films 10b to 10e having the through hole 11 are provided with the protruding members 12, and the spacers 20 are arranged between each of the films 10b to 10e. Alternatively, at least one of the resin films 10 having the through hole 11 may be provided with the protruding members 12, and the spacer 20 may be arranged between the resin film having the protruding members 12 and an adjacent film. For example, as shown in FIG. 12, in four resin films 10b to 10e having the through hole 11, only the resin film 10b may be provided with the protruding members 12, and the spacer 20 may be arranged between the resin films 10b and 10c. The spacer 20 in FIG. 8 has the approximately rectangular shape, which surrounds the through hole 11 and corresponds to the base portions of the four protruding members 12. The spacer 20 is required to be arranged at the base portions of the protruding members 12 so that the spacer 20 functions as the supporting points of the protruding member 12. Thus, as shown in FIG. 13, a plurality of spacers 20 may be independently arranged at the base portions of the protruding members 12, for example.

Second Embodiment

In the multilayer substrate 100 in FIG. 4, the material of the spacers 20 is different with those of other components in the multilayer substrate 100. Alternatively, the spacers 20 may be made of the same material as one of the other components.

Figure 14:
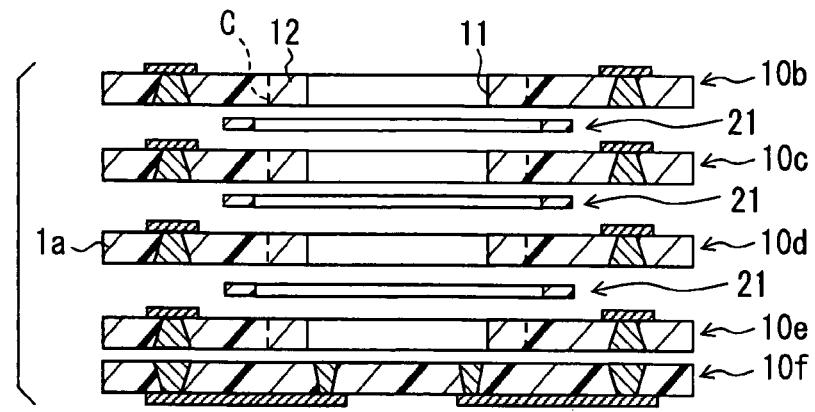
FIG. 14 is a cross-sectional view showing a stacking process of resin films according to a second embodiment of the invention.

For example, as shown in FIG. 14, spacers 21 made of the same thermoplastic resin (e.g., liquid crystal polymer) as the films 1a may be used as the spacers 20. The spacers 21 are formed by punching of a thermoplastic resin film, which is thinner than the films 1a. The spacers 21 have similar shapes with those of the spacers 20.

Figure 15:
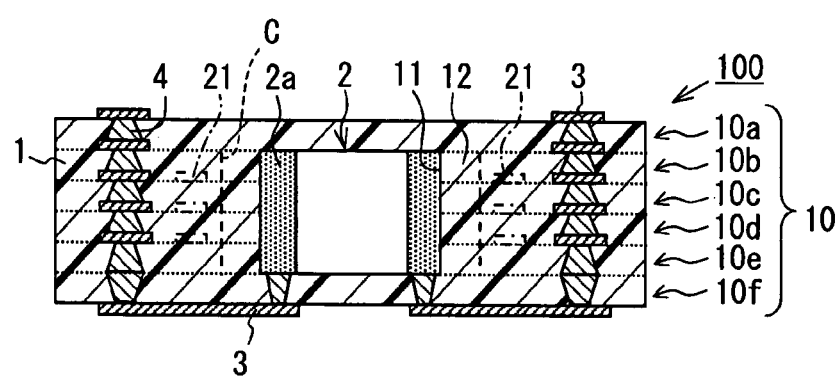
FIG. 15 is a schematic cross-sectional view showing a multilayer substrate according to the second embodiment.

In a case where the spacers 21 and the films 1a are made of the same material, when the resin films 10a to 10f are attached to each other to form the insulating base member 1 in the heating and pressing process, the spacers 21 are also softened and attach to adjacent films 10, as shown in FIG. 15. Thus, a connection reliability between the spacers 21 and the resin films 10 increases.

In addition, the spacers 21 are softened and flow, thereby clearances remaining in the insulating base member 1 are effectively reduced when the multilayer substrate 100 is formed.

Furthermore, the resin films 10 and the spacers 21 are formed separately but are made of the same material. Thus, the multilayer substrate 100 has a simple structure.

Figure 16:
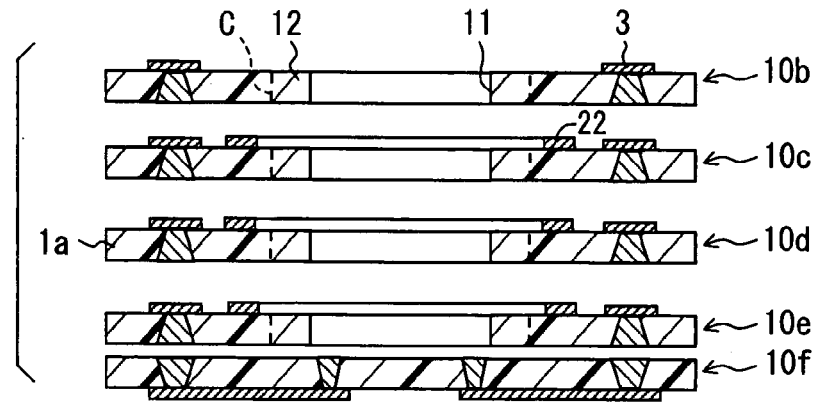
FIG. 16 is cross-sectional view showing a stacked resin films according to a modification of the second embodiment.

Alternatively, the spacers 20 may be made of the same material as one of other components without limiting the films 1a. For example, as shown in FIG. 16, the spacers 22 made of the same material as the conductive patterns 3 may be used as the spacers 20. Specifically, the spacers 22 as dummy patterns, which are not coupled with the conductive patterns 3, are arranged on upper surfaces of resin films 10c to 10e in addition to the conductive patterns 3. The spacers 22 are formed at the same time as the conductive patterns 3. The spacers 22 are integrated with the resin films 10c to 10e and are not required to be formed separately, thereby the multilayer substrate 100 has a simple structure. Alternatively, a part of the conductive patterns 3 may function as the spacers 22.

Other Embodiments

In the electric element arranging process shown in FIGS. 10A-10C, the electric element 2 is inserted into the concave part of the stacked body in a state where the resin films 10b to 10f and spacers 20 are stacked. Alternatively, the electric element 2 may be inserted in a state where the resin films 10b to 10f and the spacers 20 are attached temporarily. In the present case, the stacked resin films 10b to 10f are fixed to each other when the electric element 2 is inserted, thereby the electric element 2 is restricted from getting into an interlaminar of the stacked resin films 10b to 10f due to vibrations generated by inserting the element 2 and carrying the stacked body to a next process. The resin films 10b to 10f and the spacers 20 are attached temporarily by putting the stacked body between the heat pressing plates 120 and heating and pressing the stacked body with a lower temperature and a lower pressure compared with the heating and pressing process in FIG. 11. A preferred applied pressure is about 2 Mpa. A preferred heating temperature is about in a range from 200 to 250° C. when the films 1a are made of a liquid crystal polymer.

Such changes and modifications are to be understood as being within the scope of the present invention as defined by the appended claims.

What is claimed is:

1. A multilayer substrate comprising:
an insulating base member including a plurality of conductive patterns and a plurality of resin films, wherein the resin films are made of a thermoplastic resin and stacked and attached to each other in a stacking direction;
an electric element embedded in the insulating base member and including an electrode electrically coupled with at least one of the conductive patterns; and
a spacer, wherein:
at least one resin film has a through hole in which the electric element is inserted;
the one resin film has a plurality of protruding members, each of which protrudes from a surrounding portion of the through hole into the through hole;
one protruding member opposes to another one protruding member so that the one and the another one contact and sandwich the electric element; and
the spacer is disposed between the one resin film and an adjacent resin film in the stacking direction;
the spacer is disposed at a base portion of one of the protruding members; and
the spacer is disposed in a direction perpendicular to the stacking direction with respect to the electric element.

2. The multilayer substrate according to claim 1, wherein the spacer is thinner than one resin film in a stacking direction of the plurality of resin films.

3. The multilayer substrate according to claim 1, wherein the spacer is made of a same material as the plurality of conductive patterns.

4. The multilayer substrate according to claim 1, wherein the spacer is made of the same thermoplastic resin as the plurality of resin films.

5. The multilayer substrate according to claim 1, wherein the spacer has an approximately rectangular ring shape surrounding the through hole.

6. The multilayer substrate according to claim 1, wherein the spacer includes a plurality of spacer elements, each of which corresponds to one of the protruding members and is arranged at a base portion of the one of the protruding members.

* * * * *